(12) United States Patent
Cheng (10) Patent No.: US 6,634,891 B1
(45) Date of Patent: Oct. 21, 2003

(54) REWORKING DEVICE FOR REMOVING ELECTRICAL ELEMENTS MOUNTED ON MOTHERBOARD

(75) Inventor: Andrew C. Cheng, Diamond Bar, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/170,989

(22) Filed: Jun. 11, 2002

(51) Int. Cl.[7] .................................................. H01R 12/00

(52) U.S. Cl. ......................... 439/68; 439/923; 29/741; 29/764; 29/758; 294/99.2; 294/202

(58) Field of Search ................... 439/68, 923; 29/741, 29/764, 758, 739, 750; 294/99.2, 202

(56) References Cited

U.S. PATENT DOCUMENTS

| | | | | |
|---|---|---|---|---|
| 4,141,138 A | * | 2/1979 | Quick | 29/714 |
| 4,873,761 A | * | 10/1989 | Korsunsky et al. | 29/741 |
| 5,566,445 A | * | 10/1996 | Piao | 29/741 |
| 5,964,596 A | * | 10/1999 | Vicich et al. | 439/78 |
| 6,428,349 B1 | * | 8/2002 | Dickson et al. | 439/507 |

* cited by examiner

Primary Examiner—Gary Paumen
Assistant Examiner—Briggitte R Hammond
(74) Attorney, Agent, or Firm—Wei Te Chung (57) ABSTRACT

A reworking device (10) for removing an electrical element (20) mounted on a motherboard (40) comprises a body portion (12), a pair of hooks (14) formed at two opposite ends of the body portion for engaging with a bottom surface of the element, and an elastic arm (16) formed at each of the two opposite ends of the body portion to lift up the element when solders are reflown.

11 Claims, 8 Drawing Sheets

REWORKING DEVICE FOR REMOVING ELECTRICAL ELEMENTS MOUNTED ON MOTHERBOARD

BACKGROUND OF THE INVENTION

1. Field of the Invention

The present invention relates to a reworking device, and more particularly to a reworking device for automatically lifting an electrical element mounted on a motherboard without damaging the element as well as the motherboard.

2. Description of Related Art

Surface mounted electronic elements have become a trend in computer industry, especially when the operating speed becomes higher and higher. For example, a chip socket for electrically connecting a central processing unit (CPU) to a motherboard has been evolved from pin grid array (PGA) to ball grid array (BGA) so as to benefit high speed processing.

However, one of the problems associated with the BGA socket and other surface mounted elements is how to remove the mounted BGA socket or the like from a motherboard when it is found defective.

As a matter of fact, a typical BGA socket generally includes more than four hundred solders attached to terminal portions of terminals mounted in the socket. Those solders are arranged in array covering the entire bottom surface of the socket. For the PGA socket, the rework, i.e., removing a mounted PGA socket, can be done by reflowing the solders located between the pin legs of the socket and the through holes in the motherboard and access them from the bottom of the motherboard, while for the BGA socket, it is unlikely to access the solders located under the socket and apply heat to the solders to reflow them thereby separating the BGA socket from the motherboard.

Once the mounted BGA socket or the like is found detective, it has to be trashed away. For a reference, the estimated cost for a motherboard is at least US $50 and even more for high-end motherboard. Trashing it away only because of a defective element inevitably increases the overall cost of the motherboard.

In addition, if the mounted BGA socket is founded defective after assembling to a computer, more problems will e created.

In order to remove the mounted BGA socket or the like from the motherboard, the first problem to be solved is how to apply enough heat to the bottom of the socket to reflow the solders. The second problem is even if the solders are reflown, how to separate them just in time. Another problem is how to evenly and simultaneously heat each solder.

On the other hand, in order to prevent a defective BGA socket from occurring after it is mounted, strict requirements for the accuracy and durability of the BGA socket are required which inevitably increases the overall cost. For example, the coplanarity of the solders has to be controlled at a high precision, for example, 0.0012" as suggested in U.S. Pat. No. 6,164,983.

SUMMARY OF THE INVENTION

Accordingly, an object of the present invention is to provide a reworking device for readily heating solders located between a mounted BGA socket and a motherboard.

A second object of the present invention is to provide a reworking device which can lift a BGA socket such that the BGA socket is completely detached from a motherboard once the solders are reflown.

A third object of the present invention is to provide a reworking device which provides sufficient heat to each and every solder evenly so as to reflow the solders simultaneously.

A fourth object of the present invention is to provide a reworking device which lifts up the mounted BGA socket unintrusively thereby without damaging the motherboard.

A fifth object of the present invention is to provide a reworking device which can largely and automatically lifts up the BGA socket mounted on a motherboard.

In order to achieve the object set forth, a reworking device for removing a surface soldered element from a motherboard comprises a body portion having an elongate strip. A hook is formed at each of two opposite ends of the strip for engaging with a bottom surface of the element. An elastic arm is formed at the each of two opposite ends of the strip adapted to be supported so as to lift up the element when a solder is reflown. The device further comprises an operation arm at the each of two opposite ends. In use, operating the operation arms, the hooks are engaged to the element and the elastic arms supporting at the motherboard. When the element needs to be released from the motherboard, only need to operate the operation arms thereby causing the hooks disengaging with the element so that the element is automatically detached form the motherboard due to the lifting force provided by the elastic arms.

Other objects, advantages and novel features of the invention will become more apparent from the following detailed description of the preferred embodiment when taken in conjunction with the accompanying drawings.

DETAILED DESCRIPTION OF THE INVENTION

Reference will now be made to the drawing figures to describe the present invention in detail.

Figure 1:
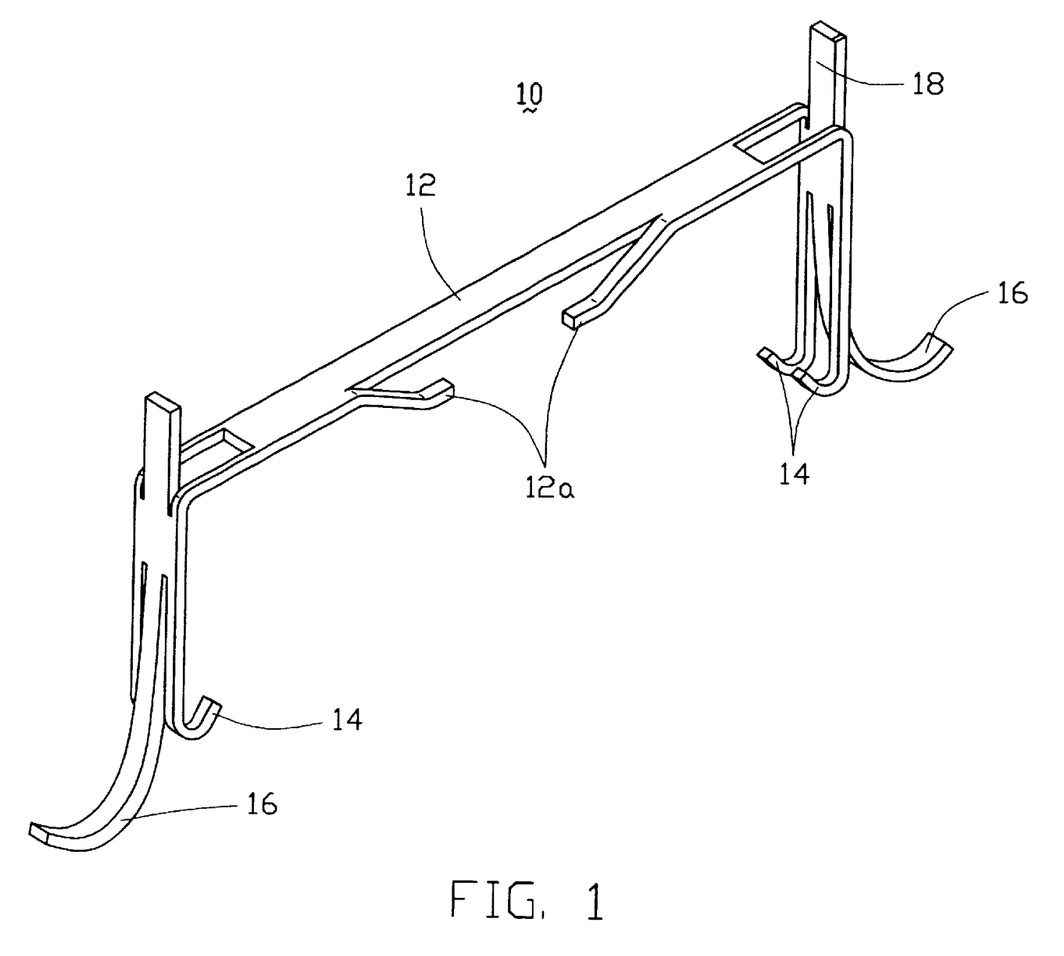
FIG. 1 is a perspective view of a reworking device of the present invention.

Referring to FIG. 1, a reworking device 10 of the present invention is used to release a surface mounted BGA (ball grid array) socket connector 20 or the like from motherboard 40 when the connector is incorrectly soldered to the motherboard 40.

Figure 2:
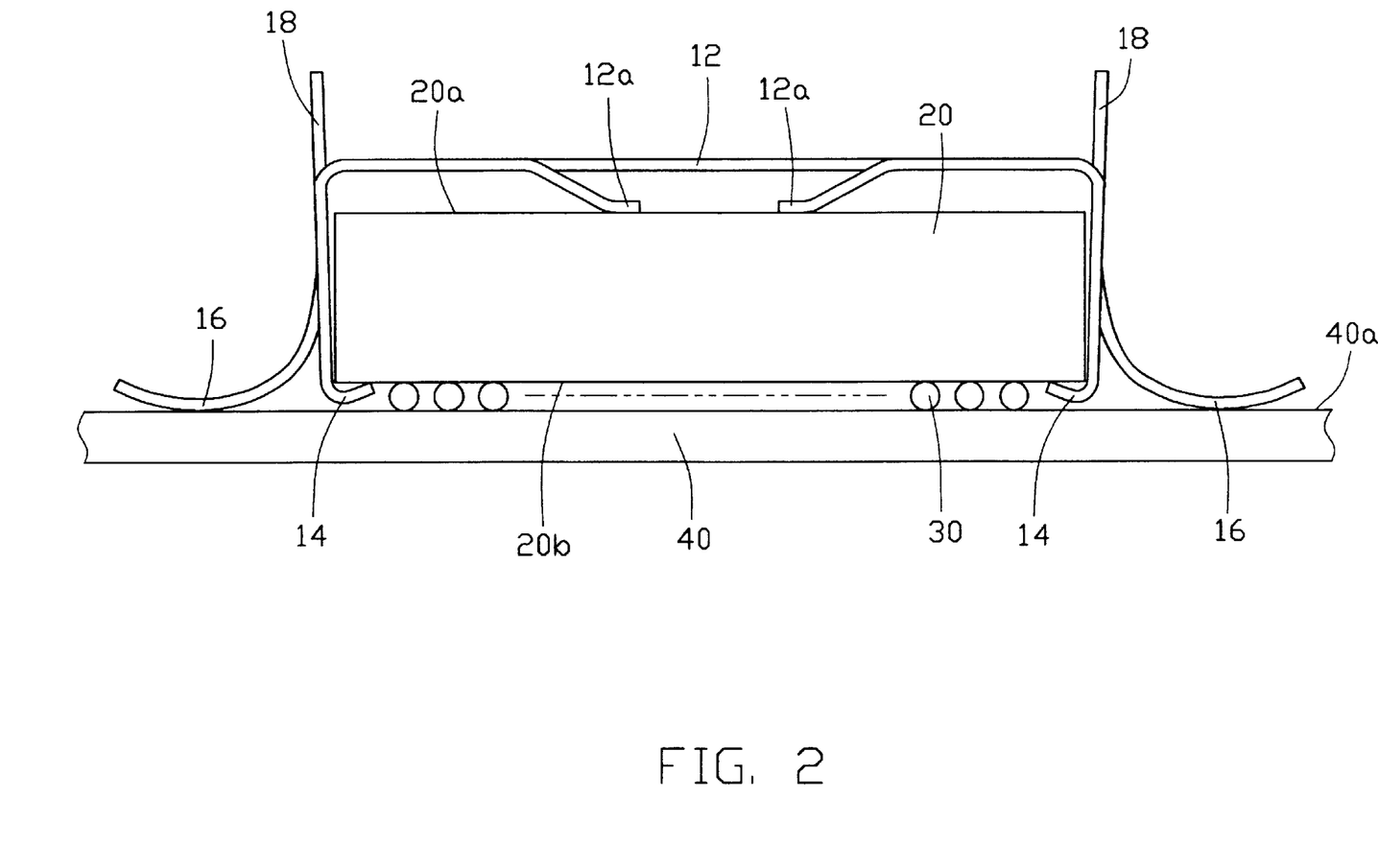
FIG. 2 is a front view of the reworking device assembled to the connector.
Figure 3:
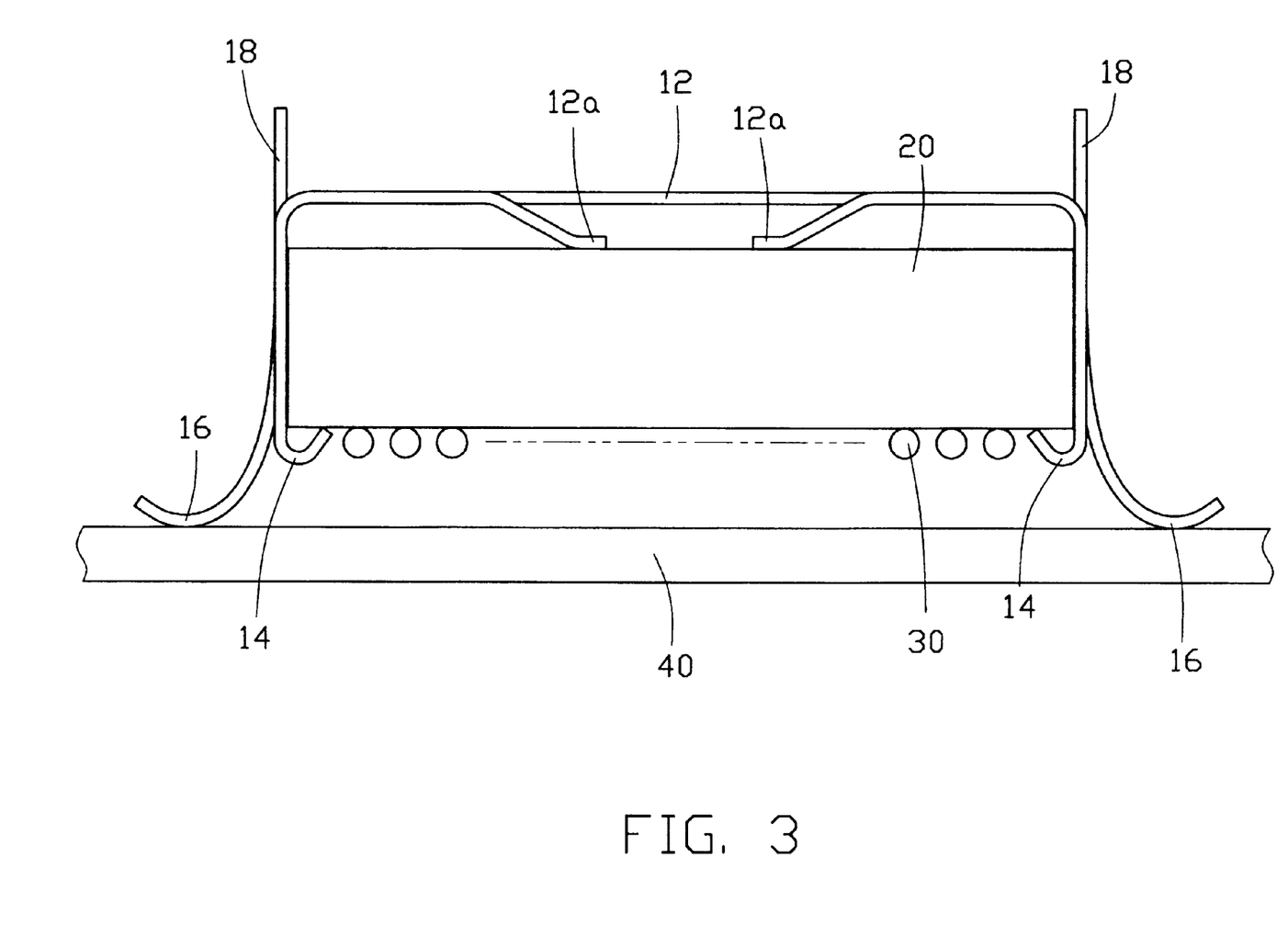
FIG. 3 is a front view of the reworking device of FIG. 2 releasing the connector from the motherboard.

Also referring to FIGS. 2 and 3, the reworking device 10 includes an elongate strip 12 having two tabs 12a confrontingly extending from a side edge of the strip 12. Free ends of the tabs 12a are located under the strip 12 for bearing against a top surface 20a of the BGA socket connector 20. Each of two opposite ends of the strip 12 downwardly extends a hook 14 curving inwardly at a free end thereof for engaging a bottom surface 20b of the connector 20. An elastic arm 16 is also downwardly formed at each of two opposite ends of the strip 12 but curving outward at a free end thereof relative to a corresponding hook 14. A bottommost portion of the elastic arm 16 is lower than a bottommost portion of the corresponding hook 14 for bearing against a top surface 40a of the motherboard 40. The device 10 further forms an upward operation arm 18 extending opposite to the elastic arm 16 at each of the two opposite ends of the strip 12.

To separate the BGA socket connector 20 mounted on the motherboard 40 from the motherboard 40, The reworking device 10 is assembled to the motherboard 40 by applying inward force to the operation arms 18 to cause the elastic arms 16 and hooks 14 to move outwardly. Because of the predetermined sizes of the hooks 14 and the elastic arms 16, the hooks 14 can readily extend into the space defined between the bottom surface 20b of the connector and the top surface 40a of the motherboard 40 to grasp the connector 20. It is noted that the hooks engage with the bottom surface 20b but not touching the top surface 40a of the motherboard 40, i.e., the device 10 is supported by the elastics arms 16 and the elastic arms 16 are in a resilient state (see FIG. 2). Then the connector 20 with the motherboard 40 together goes through an oven which can provide sufficient heat to melt the solders 30 between the connector 20 and the motherboard 40. After the solders melt, the connector 20 is readily detached from the motherboard 40 and automatically lifts up by the device 10 due to an upward force provided by the elastic arms 16 (shown in FIG. 3).

Figure 4:
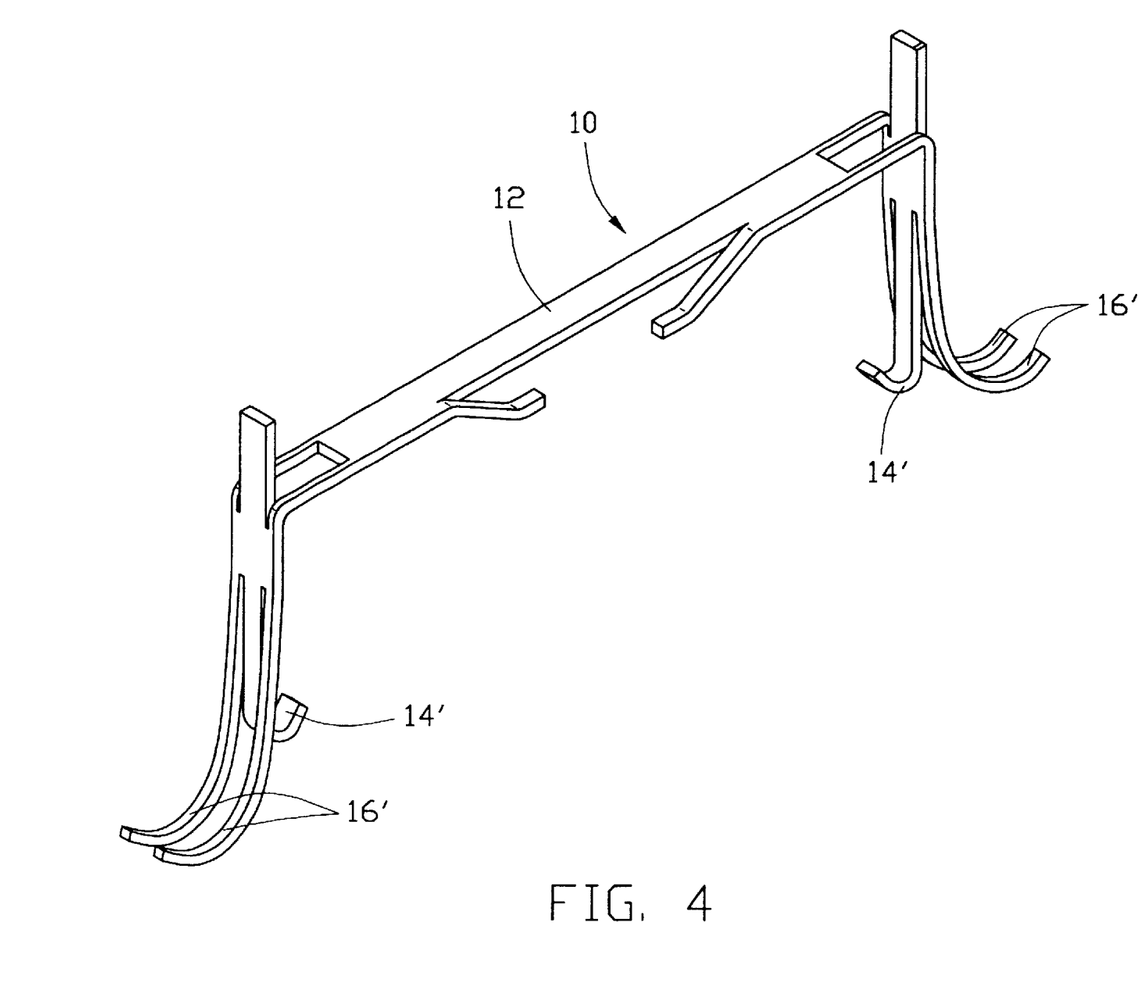
FIG. 4 is a second embodiment of the reworking device of the present invention.
Figure 5:
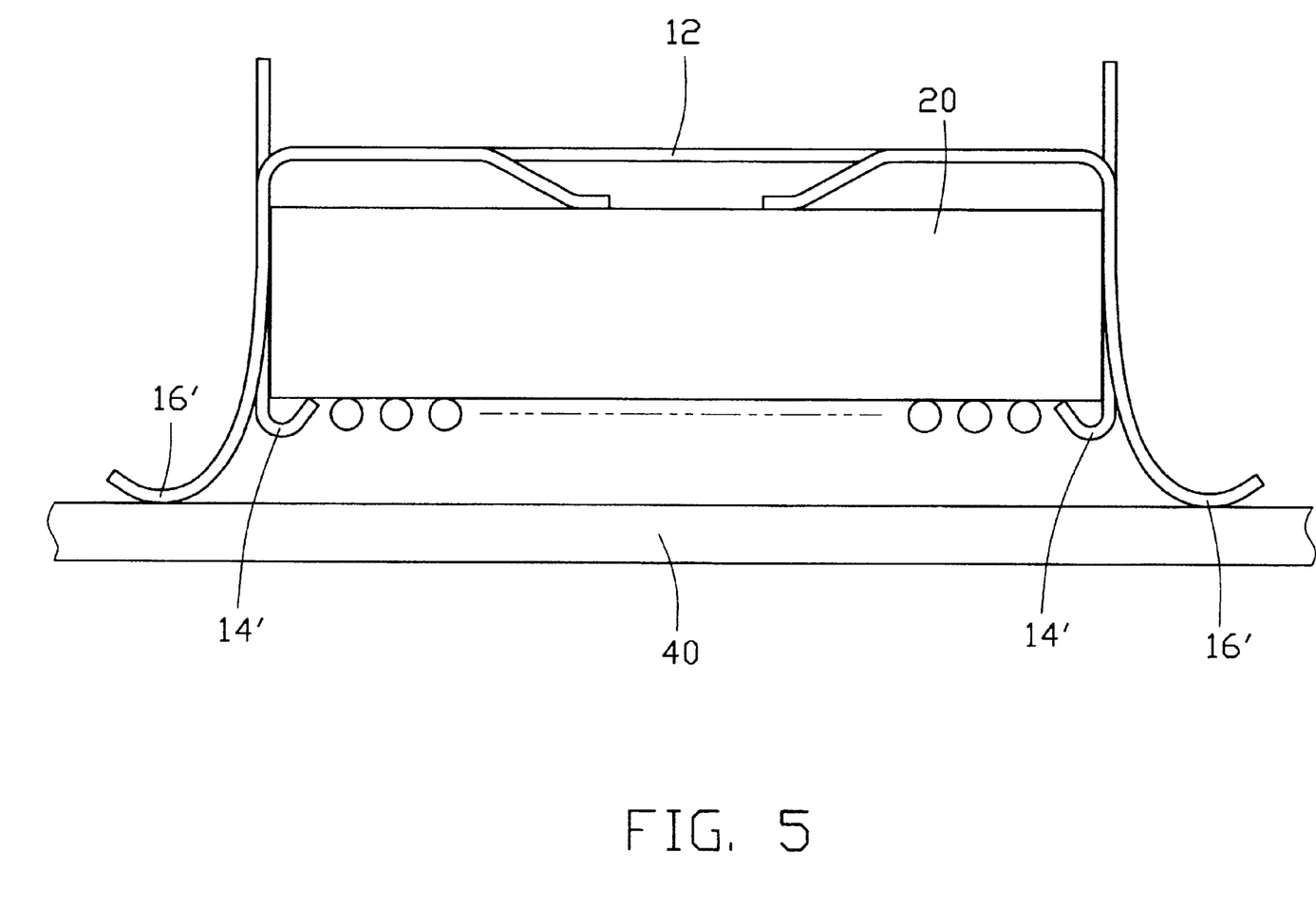
FIG. 5 is a front view of the reworking device of FIG. 4 releasing the connector from the motherboard.

FIGS. 4 and 5 show a second embodiment of the present invention, wherein the reworking device defines two elastic arms 16' at each of two ends of the body and a hook 14' extending between the two elastic arms 16'. This increases the reliability of the engagement between the elastic arm 16' and the motherboard 40.

Figure 6:
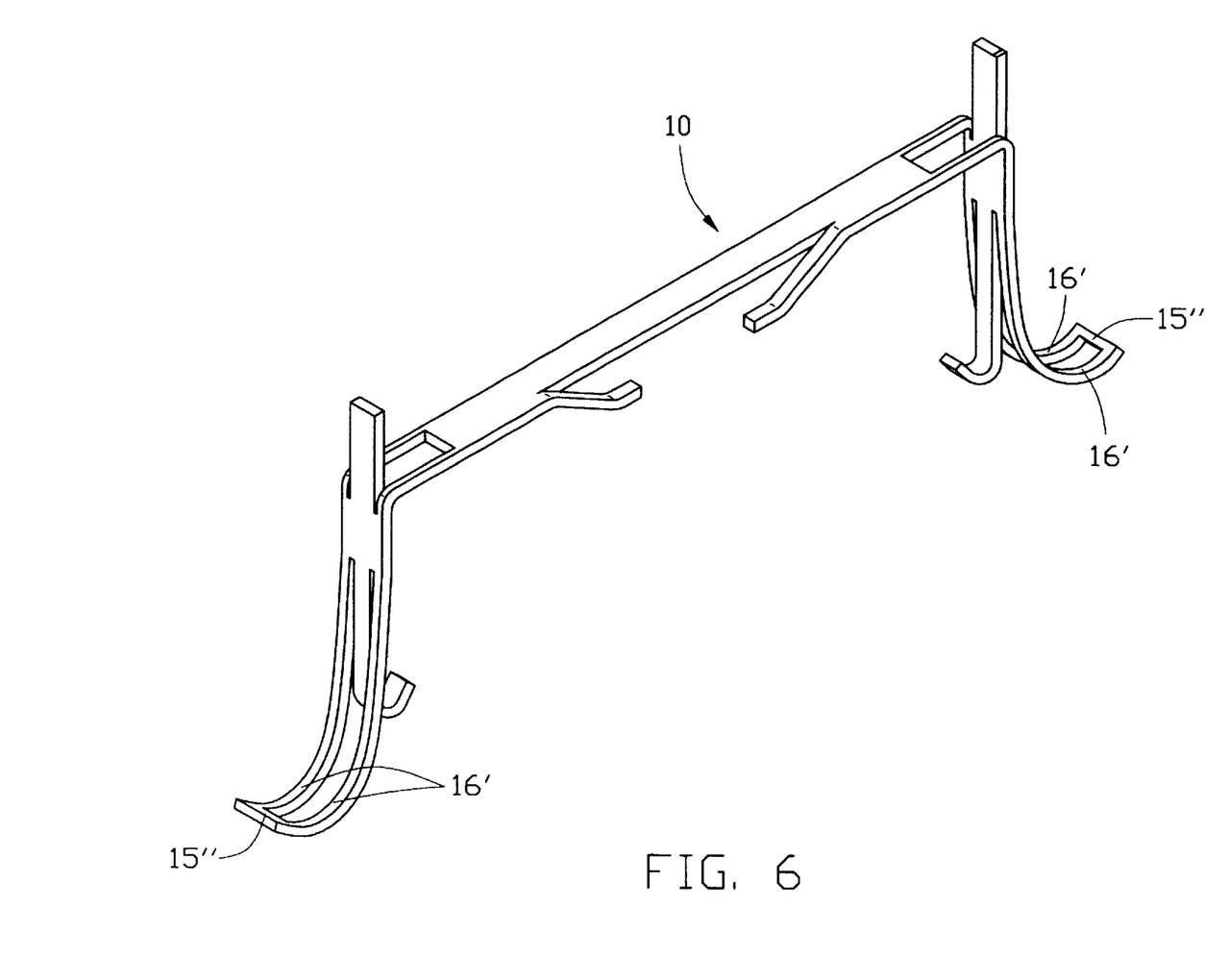
FIG. 6 is a third embodiment of the reworking device of the present invention.

FIG. 6 shows a third embodiment of the reworking device 10 of the present invention. It is similar to FIG. 4, except that the reworking device of the third embodiment further defines a connecting portion 15" between free ends of two elastic arms 16'. Thus, the engaging reliability between the elastic arms 16' is further increased relative to the second embodiment of the present invention.

Figure 7:
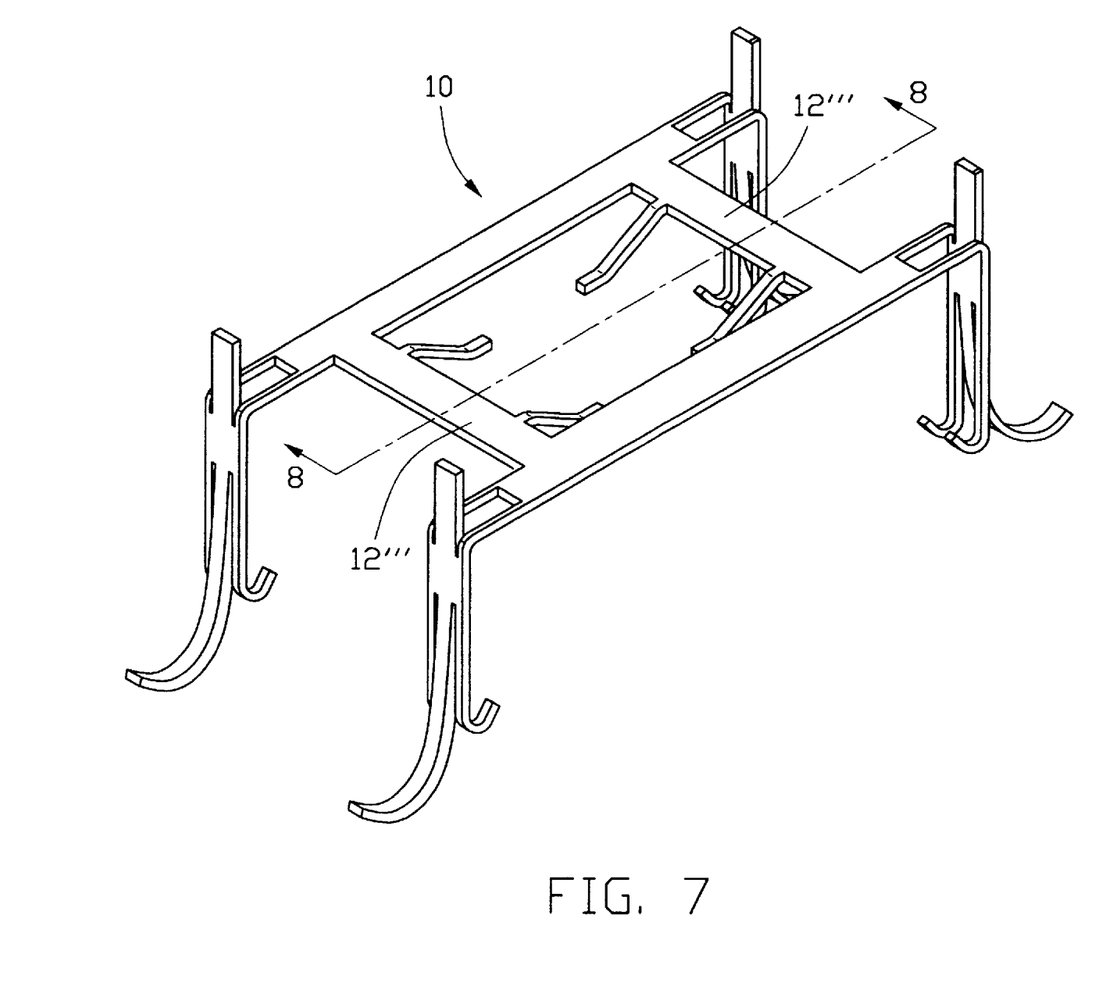
FIG. 7 is a fourth embodiment of the reworking device of the present invention.
Figure 8:
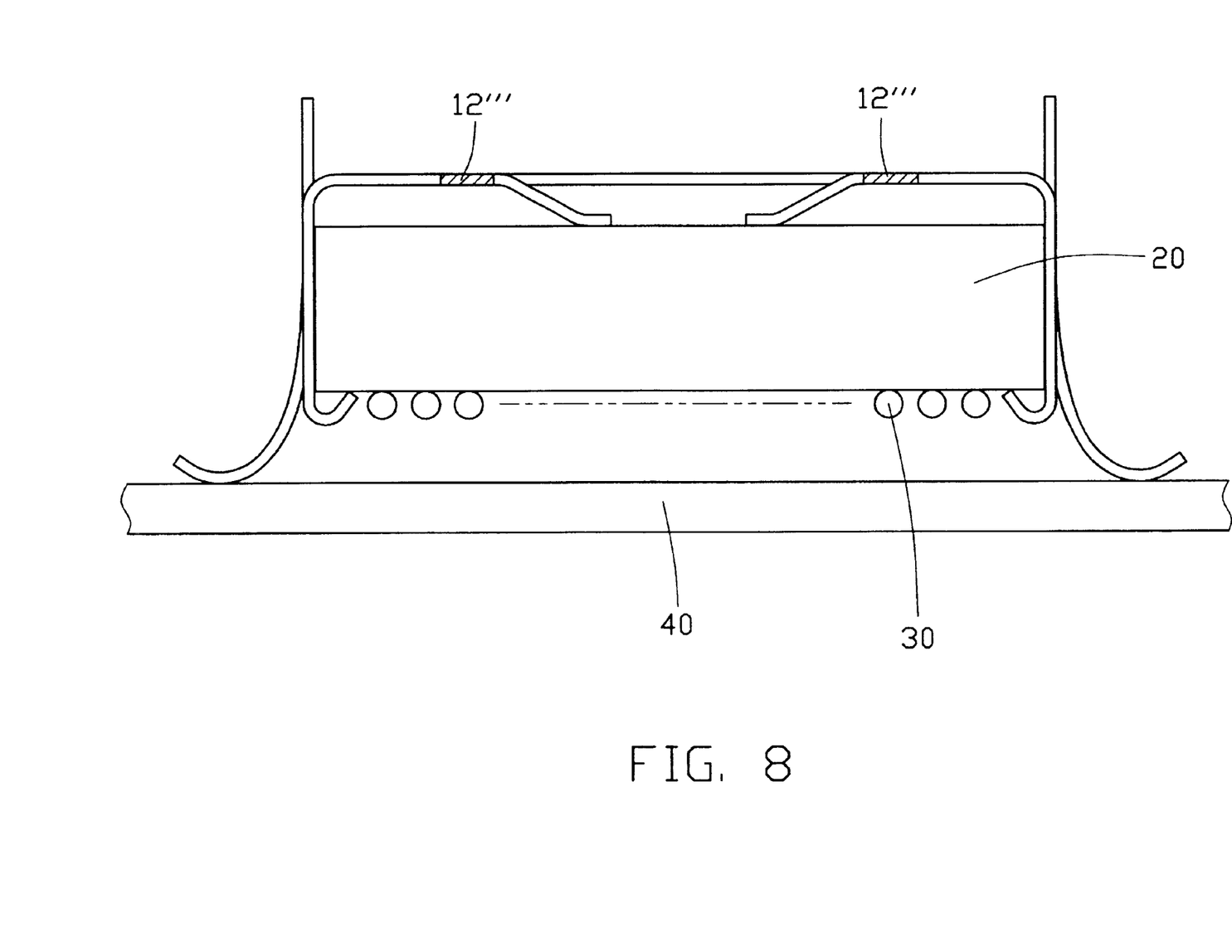
FIG. 8 is a partially cross-sectional view of the fourth embodiment of the reworking device of FIG. 7 releasing the connector from the motherboard.

FIGS. 7 and 8 show a fourth embodiment of the reworking device which includes a pair of body portions connected by two connecting strips 12'''. As can be understood, such a design enables the device 10 to reliably support the connector 20 while lifting the connector 20 from the motherboard 40.

It is noted that the present invention can be also used to remove other electrical elements mounted on a motherboard by through hole.

A first advantage of the present invention is that the solders located between the connector and the motherboard can be readily reflown.

A second advantage of the present invention is that the reworking device can lift the connector such that the connector is completely detached from the PCB once the solders are reflown.

A third advantage of the present invention is that the rewoking device provides sufficient heat to each and every solder evenly so as to reflow the solders simultaneously.

A fourth advantage of the present invention is that the reworking device lifts up the connector homogeneously thereby without damaging the motherboard.

A fifth advantage of the present invention is that the reworking job can be largely and automatically done because the removing device can automatically lift up the socket from the motherboard once the solders are reflown.

It is to be understood, however, that even though numerous characteristics and advantages of the present invention have been set forth in the forgoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A reworking device for removing an electrical element mounted on a motherboard, comprising:
   a body portion;
   grasping means formed at each of two opposite ends of the body portion for engaging with a portion of the electrical element; and
   an elastic arm formed at the each of the two opposite ends of the body portion and adapted to be supported by the motherboard so as to lift up the electrical element when solders between the element and the motherboard are heated to melt, wherein the body portion comprises an elongated strip and two opposite cantilever tabs formed at a side of the strip to bear against a top surface of the element.

2. The reworking device as claimed in claim 1, wherein an operation arm is upwardly formed at the each of the two opposite ends of the body portion.

3. The reworking device as claimed in claim 1, wherein the grasping means includes a hook at the each of the two opposite ends of the body portion to engage to the electrical element.

4. The reworking device as claimed in claim 3, wherein the hooks engage at a bottom surface of the electrical component.

5. A The reworking device as claimed in claim 3, wherein the elastic arms are curved opposite to corresponding hooks for supporting at a top surface of the motherboard.

6. A reworking device for removing an incorrectly mounted element from a motherboard, comprising:
   a securing means having:
       an elongate body portion for attaching to the element; and
       a securing portion integrally formed at each of two opposite ends of the body portion for securing to a portion of the element; and
   a lifting means integrally formed with the body portion and being supportable on the motherboard to provide a lifting force to the securing portions of the securing means thereby lifting the element remote from the motherboard when solders between the element and the motherboard are heated to melt, wherein the body portion is a flat strip and forms a pair of cantilever tabs extending toward a top surface of the element.

7. The reworking device as claimed in claim 6, wherein the securing portion includes a pair of hooks engaging a bottom surface of the element.

8. The reworking device as claimed in claim 6, wherein the lifting means comprises an elastic arm formed at each of two opposite ends of the body portion.

9. The reworking device as claimed in claim 6, wherein the element is a surface mounted socket connector, solders being located between a bottom surface of the connector and a top surface of the motherboard.

10. The reworking device as claimed in claim 9, wherein the securing portion is able to extend into the space defined between the bottom surface of the connector and the top surface of the motherboard.

11. The reworking device as claimed in claim 10, wherein the securing portion engages with the bottom surface of the connector and is spaced from the top surface of the motherboard.

* * * * *